United States Patent
Keller et al.

(10) Patent No.: US 9,609,709 B2
(45) Date of Patent: Mar. 28, 2017

(54) MULTI-SEGMENT LED COMPONENTS AND LED LIGHTING APPARATUS INCLUDING THE SAME

(75) Inventors: Bernd Peter Keller, Santa Barbara, CA (US); Robert D. Underwood, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 386 days.

(21) Appl. No.: 13/590,982

(22) Filed: Aug. 21, 2012

(65) Prior Publication Data

US 2014/0055032 A1    Feb. 27, 2014

(51) Int. Cl.
*H05B 37/00* (2006.01)
*H05B 33/08* (2006.01)
*H01L 25/075* (2006.01)

(52) U.S. Cl.
CPC ....... *H05B 33/083* (2013.01); *H05B 33/0803* (2013.01); *H01L 25/0753* (2013.01); *H01L 2924/0002* (2013.01)

(58) Field of Classification Search
CPC .............. H05B 33/083; H05B 33/0824; H05B 33/0815; H05K 1/183
USPC ............ 315/185 R, 291, 122, 297, 307, 312; 362/249.02, 612
See application file for complete search history.

(56) References Cited

U.S. PATENT DOCUMENTS

| | | | |
|---|---|---|---|
| 7,213,940 B1 | 5/2007 | Van De Ven et al. | |
| 7,688,002 B2 * | 3/2010 | Ashdown et al. | 315/291 |
| 8,324,840 B2 * | 12/2012 | Shteynberg | H05B 33/083 |
| | | | 315/185 R |
| 8,471,495 B2 | 6/2013 | Muguruma et al. | |
| 8,519,631 B2 | 8/2013 | Lee et al. | |
| 8,742,671 B2 | 6/2014 | van de Ven et al. | |
| 8,917,025 B2 | 12/2014 | Park et al. | |
| 2004/0189218 A1 | 9/2004 | Leong et al. | |
| 2007/0013647 A1 | 1/2007 | Lee et al. | |
| 2008/0122376 A1 | 5/2008 | Lys | |
| 2009/0135592 A1 * | 5/2009 | Hamada | 362/231 |
| 2009/0170226 A1 | 7/2009 | Wall, Jr. | |
| 2010/0109557 A1 | 5/2010 | Bouchard | |
| 2010/0207150 A1 | 8/2010 | Grajcar | |
| 2010/0295460 A1 | 11/2010 | Lin et al. | |
| 2010/0327765 A1 * | 12/2010 | Melanson et al. | 315/291 |
| 2011/0101883 A1 | 5/2011 | Grajcar | |
| 2011/0109244 A1 | 5/2011 | Grajcar | |

(Continued)

FOREIGN PATENT DOCUMENTS

| | | |
|---|---|---|
| CN | 1943276 A | 4/2007 |
| CN | 101529983 A | 9/2009 |

OTHER PUBLICATIONS

U.S. Appl. No. 13/235,103, filed Sep. 16, 2011.

(Continued)

*Primary Examiner* — Thai Pham
*Assistant Examiner* — Borna Alaeddini
(74) *Attorney, Agent, or Firm* — Myers Bigel, P.A.

(57) ABSTRACT

An integrated circuit component can include an integrated circuit package and a plurality of terminals provided on the exterior of the integrated circuit package. The terminals are configured to provide electrical connectivity to an interior of the integrated circuit package and a plurality of light emitting diode (LED) segments that includes an LED string in the interior of the package, coupled to the plurality of terminals.

19 Claims, 7 Drawing Sheets

(56) References Cited

U.S. PATENT DOCUMENTS

| | | | |
|---|---|---|---|
| 2011/0199003 A1* | 8/2011 | Muguruma | H05B 33/083 315/122 |
| 2011/0227485 A1* | 9/2011 | Huynh | H05B 33/083 315/127 |
| 2012/0062146 A1* | 3/2012 | Huang | H05B 33/0809 315/294 |

OTHER PUBLICATIONS

U.S. Appl. No. 13/235,127, filed Sep. 16, 2011.
U.S. Appl. No. 13/360,145, filed Jan. 27, 2012.
Chinese Second Office Action and Search Report Corresponding to Chinese Application No. 201280044036.9; Date of Notification: Dec. 3, 2015; Foreign Text, 13 Pages, English Translation Thereof, 9 Pages.

* cited by examiner

MULTI-SEGMENT LED COMPONENTS AND LED LIGHTING APPARATUS INCLUDING THE SAME

FIELD

The present inventive subject matter relates to lighting apparatus and methods and, more particularly, to LED lighting apparatus.

BACKGROUND

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs), which may include inorganic LEDs, which may include semiconductor layers forming p-n junctions, and/or organic LEDs (OLEDs), which may include organic light emission layers.

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs). Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e., electrons and holes, in a light emitting layer or region.

Solid state lighting panels are commonly used as backlights for small liquid crystal display (LCD) screens, such as LCD display screens used in portable electronic devices. In addition, there has been increased interest in the use of solid state lighting panels as backlights for larger displays, such as LCD television displays.

SUMMARY

Embodiments according to the present invention can provide multi-segment LED components. Pursuant to these embodiments, an integrated circuit component can include an integrated circuit package and a plurality of terminals provided on the exterior of the integrated circuit package. The terminals are configured to provide electrical connectivity to an interior of the integrated circuit package and a plurality of light emitting diode (LED) segments that include an LED string in the interior of the package, coupled to the plurality of terminals.

In some embodiments according to the invention, the LED segments can include separately biased LED segments having nodes at opposing ends of the separately biased LED segments electrically connected to respective ones of the plurality of terminals, where the separately biased LED segments are configured to be separately switched in/out of the LED string via the plurality of terminals in response to an ac voltage used to bias the LED string.

In some embodiments according to the invention, the component can further include an integrated circuit submount in the interior of the integrated circuit package, where the integrated circuit submount can have the plurality of LED segments mounted thereon, wherein the integrated circuit submount is at least partially encapsulated by the integrated circuit package.

In some embodiments according to the invention, each one of the plurality of LED segments comprises at least one LED on a die. In some embodiments according to the invention, a number of the plurality of LED segments are coupled together in series. In some embodiments according to the invention, a number of LEDs in the plurality of LED segments are coupled in parallel with one another.

In some embodiments according to the invention, LEDs in the plurality of LED segments are covered by at least one lens. In some embodiments according to the invention, the plurality of LED segments can include blue-shifted yellow LEDs, red LEDs, and/or white LEDs.

In some embodiments according to the invention, the plurality of terminals can include ac voltage terminals that are configured to receive an ac voltage, where the integrated circuit component can further include an LED lighting driver circuit, in the interior of the integrated circuit package, electrically coupled to the ac voltage terminals and to the plurality of LED segments.

In some embodiments according to the invention, the LED lighting driver circuit can include a segmented ac circuit electrically coupled to the plurality of LED segments, an EMI filter stage coupled to the segmented ac circuit, and a rectifier circuit stage coupled to the plurality of terminals.

In some embodiments according to the invention, the segmented ac circuit can further include a plurality of current diversion circuits coupled to respective nodes at opposing ends of ones of the plurality of LED segments via respective ones of the plurality of terminals, the plurality of current diversion circuits being configured to be selectively enabled and disabled to separately bias the ones of the plurality of LED segments responsive to an ac voltage provided to the LED lighting driver circuit.

In some embodiments according to the invention, the separately biased LED segments can include N separately biased LED segments and the plurality of terminals comprises N+1 terminals electrically connected to the nodes. In some embodiments according to the invention, the N+1 terminals are configured to electrically couple to an external LED lighting driver circuit configured to separately bias the N separately biased LED segments, outside the integrated circuit component.

DETAILED DESCRIPTION OF EMBODIMENTS ACCORDING TO THE INVENTION

Figure 1:
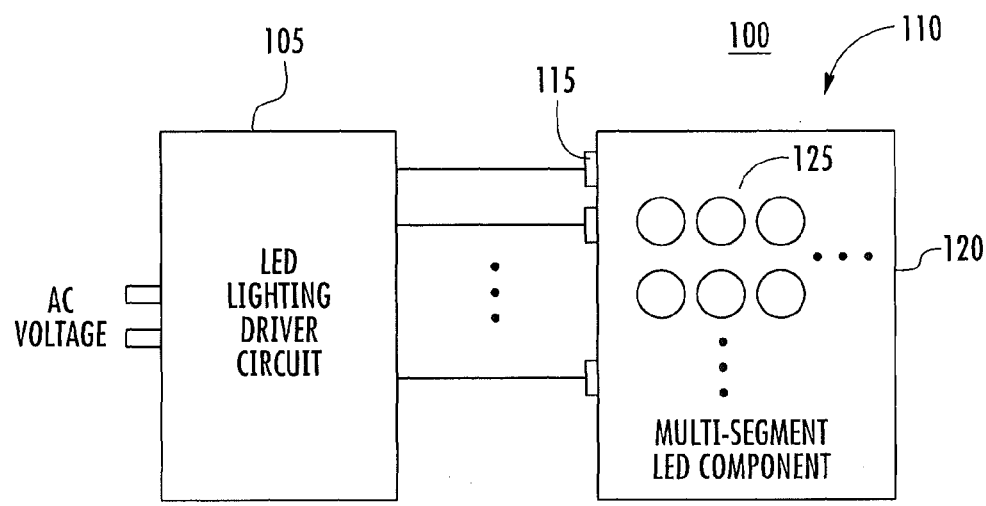
FIG. 1 is a block diagram illustrating a multi-segment LED component coupled to an LED lighting driver circuit in some embodiments according to the invention.

Embodiments of the present inventive subject matter now will be described more fully hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

The expression "lighting apparatus", as used herein, is not limited, except that it indicates that the device is capable of emitting light. That is, a lighting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing ac incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

As described herein below in greater detail, multiple segments of an LED circuit can be included in a component that includes a plurality of terminals (such as pins) that facilitate the connection of a driver circuit without the need for the assembly of individual segments of LEDS as provided in the prior art. In some embodiments according to the invention, a multi-segment LED component can provide N segments of an LED string where each of the segments may be separately biased (i.e., activated) by providing an adequate forward voltage across the segment. The multi-segment component can include N+1 terminals to allow a driver circuit access to the separately biased LED segments. For example, in some embodiments according to the invention, the driver circuit can provide a forward bias across each of the segments in the LED string as the level of an AC voltage provided to the driver increases. In this way, the driver circuit may enable the LED segments in the LED string in a serial fashion as the AC voltage varies. Moreover, the multi-segment LED component can facilitate a more modular approach to the construction of LED lighting products. For example, in some embodiments according to the invention, multi-segment LED components can be coupled in parallel with one another to change the output of light provided by a lighting apparatus. In still other embodiments according to the invention, the multi-segment LED components can be coupled in series with one another to provide still other types of light output.

FIG. 1 is a schematic illustration of an LED lighting apparatus 100 that includes an LED lighting driver circuit 105 coupled to a multi-segment LED component 110. According to FIG. 1, the multi-segment component 110 can include LEDs 125 arranged in a plurality of LED segments which are interconnected to provide an LED string controlled by the LED lighting driver circuit 105.

The multi-segment LED component 110 is controlled by the LED lighting driver circuit 105 via a plurality of terminals 115 located on an exterior of an integrated circuit package 120 that partially encapsulates the LEDs 125. In operation, an AC voltage is provided to the LED lighting driver circuit 105 which can separately bias the LED segments using the plurality of terminals 115. For example, as the level of the AC voltage begins to increase, the LED lighting driver circuit 105 can forward bias a first LED segment of the multi-segment LED component 110 by providing a forward bias voltage across the first two of the plurality of terminals 115, whereas the remainder of the LED segments in the LED string remain off. As the AC voltage level continues to increase, the LED lighting driver circuit 105 can separately forward bias the remaining LED segments until each of the LED segments in the multi-segment LED component 110 is enabled. This process is then reversed as the level of the AC voltage is reduced during the latter half of the voltage cycle.

Figure 2:
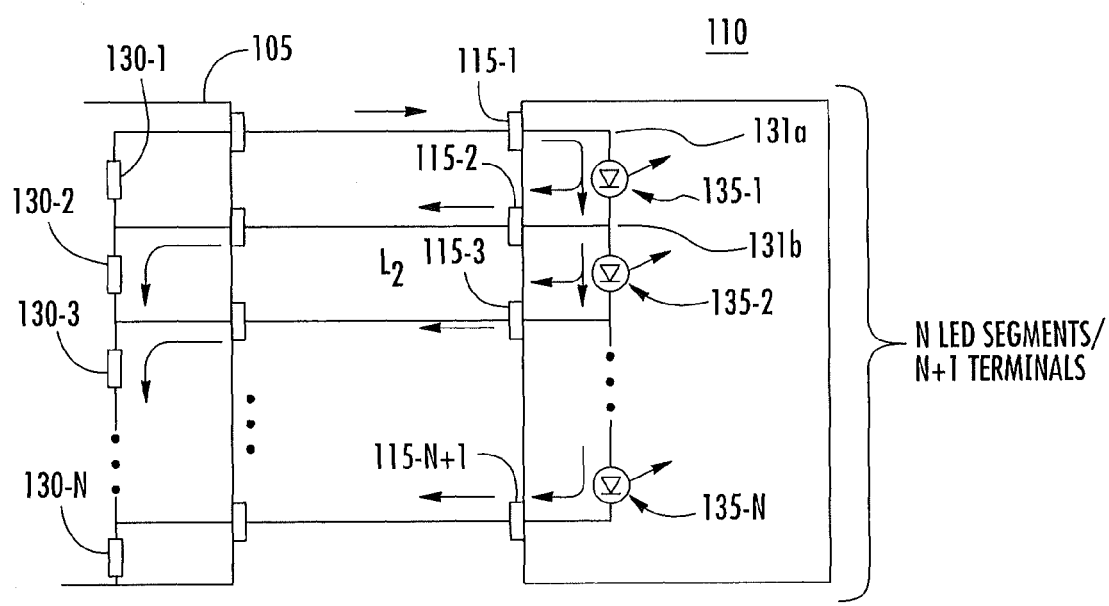
FIG. 2 is a block diagram that illustrates N LED segments and N+1 terminals of the multi-segment LED component shown in FIG. 1 in some embodiments according to the invention.

FIG. 2 is a schematic illustration of the multi-segment LED component 110 coupled to the LED lighting driver circuit 105 including a plurality of current diversion circuits 130-1 to 130-N used to separately bias N LED segments in the LED string in some embodiments according to the invention. According to FIG. 2, the component 110 includes N LED segments 135-1 to 135-N coupled in series with one another that are separately biased using the N+1 terminals 115-1 to 115-N+1. Each of the LED segments 135-1 to 135-N includes a pair of nodes 131a/b located on opposing sides of the LED segments 135-1 to 135-N. The nodes 131a/b correspond to the N+1 terminals through which the driver circuit 105 can separately bias the respective LED segment. For example, in operation, the driver circuit 105 can apply a forward bias across the first LED segment 135-1 by applying a forward voltage across the nodes 131a/b so that the first LED segment 135-1 turns on. In this operation, current I1 flows through the first LED segment 135-1, out of the component 110 on terminal 115-2, to the enabled current diversion circuit 130-2 in the LED lighting driver circuit 105. During this operation, the remainder of the LED segments 135-2 to 135-N are deactivated so as to remain off. As the ac voltage level increases, the reminder of the LED segments 135-2 to 135-N can be separately biased by the LED lighting driver circuit 105 by selectively disabling the respective current diversion circuits 130-2 to 130-N once the AC voltage level has risen to the point where the respective LED segment 135-2 to 135-N may be forward biased.

Figure 3:
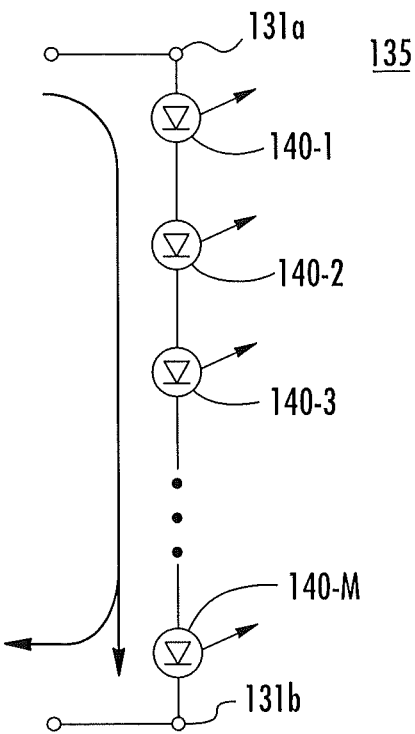
FIG. 3 is a schematic illustration of a single LED segment included in the multi-segment LED component shown in FIGS. 1 and 2 in some embodiments according to the invention.

FIG. 3 is a schematic illustration of a single LED segment 135 shown in FIG. 2 in some embodiments according to the invention. According to FIG. 3, the LED segment 135 can be constructed from a series connection of M LEDs 140-1 to 140-M, each of which may have a relatively low forward bias voltage compared to the overall forward bias voltage of the LED segment 135. For example, each of the LEDs 140-1 to 140-M may have a forward bias voltage of about three volts such that when the LEDs are coupled in series with one another, the overall forward bias voltage for the LED segment 135 is significantly greater, such as about 48 volts where 16 LEDs (each having a forward bias voltage of about 3 volts) are connected in series with one another. It will be further understood that the LEDs 140-1 to 140-M shown in the segment 135 of FIG. 3 may be fabricated on separate dies and connected to one another to provide the LED segment 135 or may be fabricated on a single die and connected to one another to provide the LED segment 135.

Figure 4:
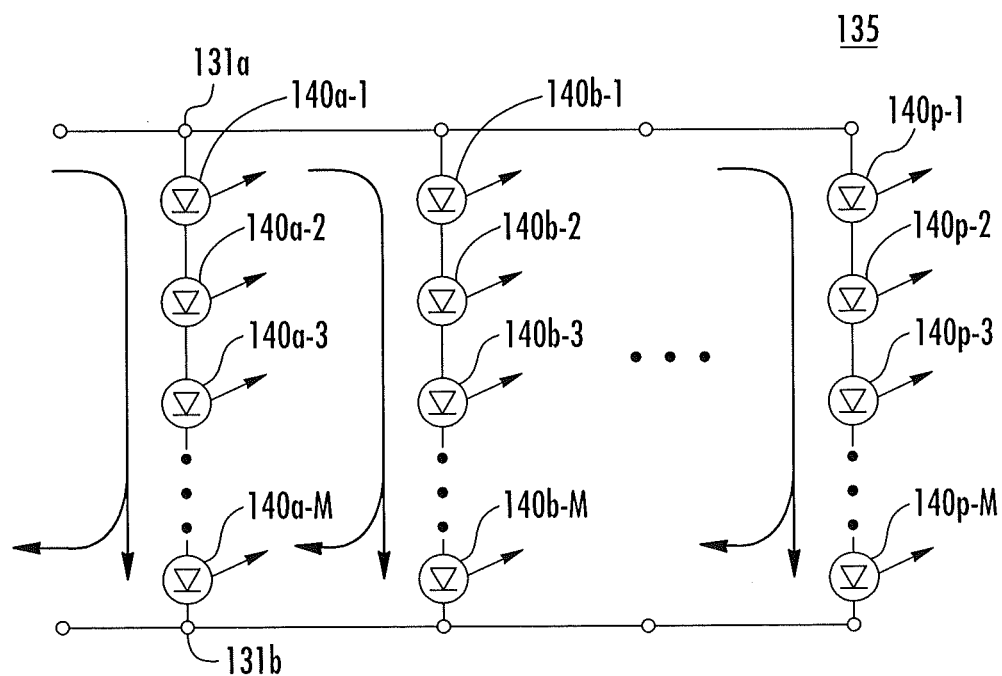
FIG. 4 is a schematic illustration of a single LED segment included in the multi-segment LED component shown in FIGS. 1 and 2 in some embodiments according to the invention.

FIG. 4 is a schematic diagram illustrating a single LED segment 135. For example, according to FIG. 4, the single LED segment 135 can include M times P LEDs connected to one another to provide the LED segment 135 as described above. The single LED segment 135 can include multiple serial connections of LEDs in parallel. It will be further understood that in some embodiments according to the invention, combinations of the arrangements shown in FIGS. 3 and 4 can be provided. For example, in some embodiments according to the invention, a first LED segment 135 may include LEDs arranged only in series with one another (FIG. 3) whereas another LED segment 135 in the same LED string may include parallel arrangements of LEDs, as shown for example in FIG. 4.

It will be further understood that the LED segments 135 can include LEDs 125 of varying colors to provide lighting products having a relatively high color rendering index (CRI). One approach to providing high CRI lighting is to use "white LED lights" (i.e., lights which are perceived as being white or near-white). A representative example of a white LED lamp includes a package of a blue light emitting diode chip, made of gallium nitride (GaN), coated with a phosphor such as YAG. In such an LED lamp, the blue light emitting diode chip produces a blue emission and the phosphor produces yellow fluorescence on receiving that emission, which is sometimes referred to as blue shifted yellow (BSY). For instance, in some designs, white light emitting diodes are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light.

Figure 10:
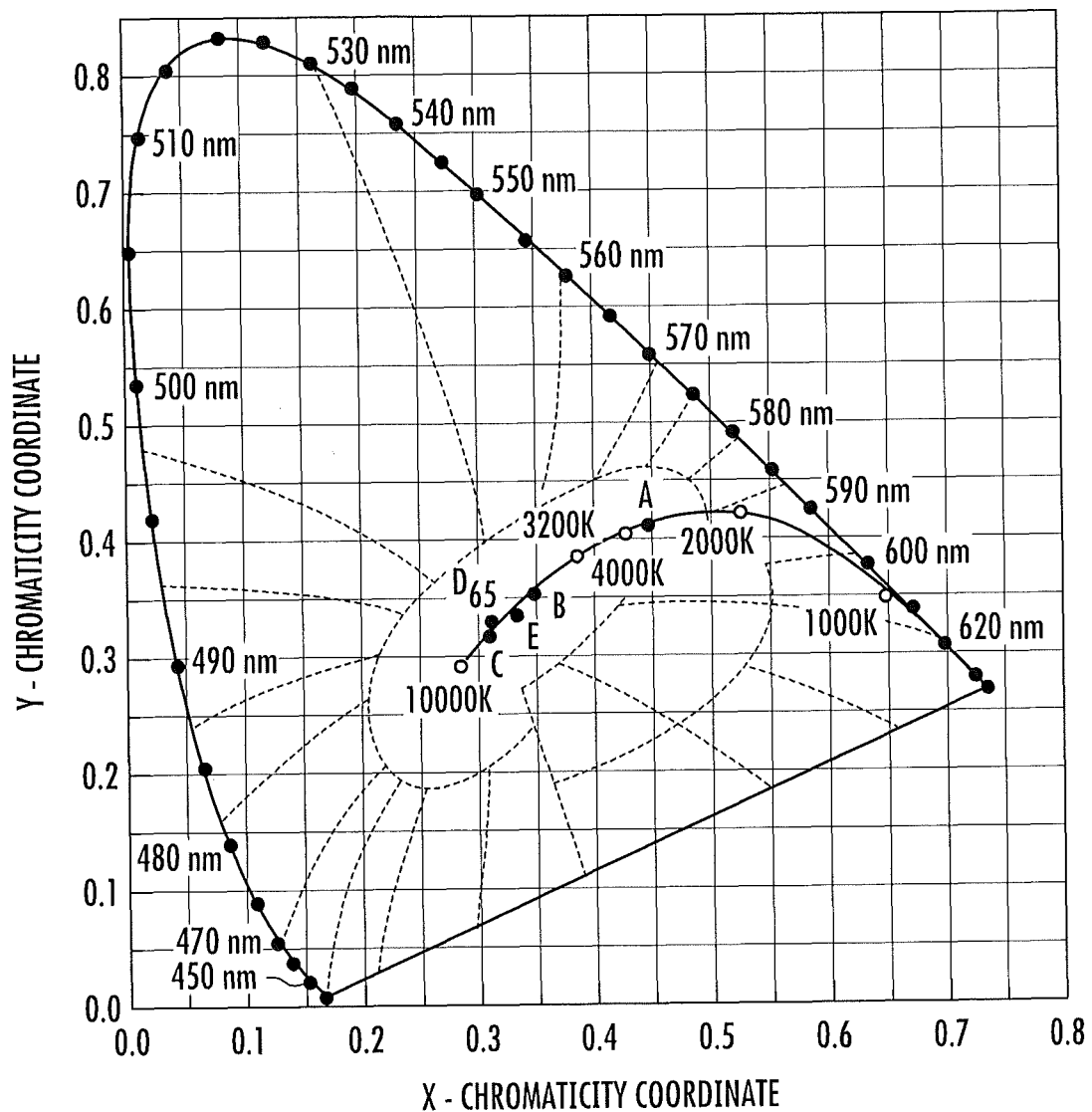
FIG. 10 is a schematic representation of the 1931 CIE Chromaticity Diagram.

More specifically, a "BSY LED" refers to a blue LED and an associated recipient luminophoric medium that together emit light having a color point that falls within a trapezoidal "BSY region" on the 1931 CIE Chromaticity Diagram defined by the following x, y chromaticity coordinates: (0.32, 0.40), (0.36, 0.48), (0.43, 0.45), (0.42, 0.42), (0.36, 0.38), (0.32, 0.40), which is generally within the yellow color range, see for example, FIG. 10. A "BSG LED" refers to a blue LED and an associated recipient luminophoric medium that together emit light having a color point that falls within a trapezoidal "BSG region" on the 1931 CIE Chromaticity Diagram defined by the following x, y chromaticity coordinates: (0.35, 0.48), (0.26, 0.50), (0.13, 0.26), (0.15, 0.20), (0.26, 0.28), (0.35, 0.48), which is generally within the green color range. A "BSR LED" refers to a blue LED that includes a recipient luminophoric medium that emits light having a dominant wavelength between 600 and 720 nm in response to the light emitted by the blue LED. A BSR LED will typically have two distinct spectral peaks on a plot of light output versus wavelength, namely a first peak at the peak wavelength of the blue LED in the blue color range and a second peak at the peak wavelength of the luminescent materials in the recipient luminophoric medium when excited by the light from the blue LED, which is within the red color range. Typically, the red LEDs and/or BSR LEDs will have a dominant wavelength between 600 and 660 nm, and in most cases between 600 and 640 nm.

The use of these types (and other) LEDs can promote truer color reproduction, which is typically measured using the Color Rendering Index (CRI). CRI is a relative measurement of how the color rendition of an illumination system compares to that of a blackbody radiator, i.e., it is a relative measure of the shift in surface color of an object when lit by a particular lamp. The CRI equals 100 if the color coordinates of a set of test colors being illuminated by the illumination system are the same as the coordinates of the same test colors being irradiated by the blackbody radiator. Daylight has the highest CRI (of 100), with incandescent bulbs being relatively close (about 95), and fluorescent lighting being less accurate (70-85). Certain types of specialized lighting have relatively low CRI's (e.g., mercury vapor or sodium, both as low as about 40 or even lower). Sodium lights are used, e.g., to light highways. Driver response time, however, significantly decreases with lower CRI values (for any given brightness, legibility decreases with lower CRI).

Figure 5A:
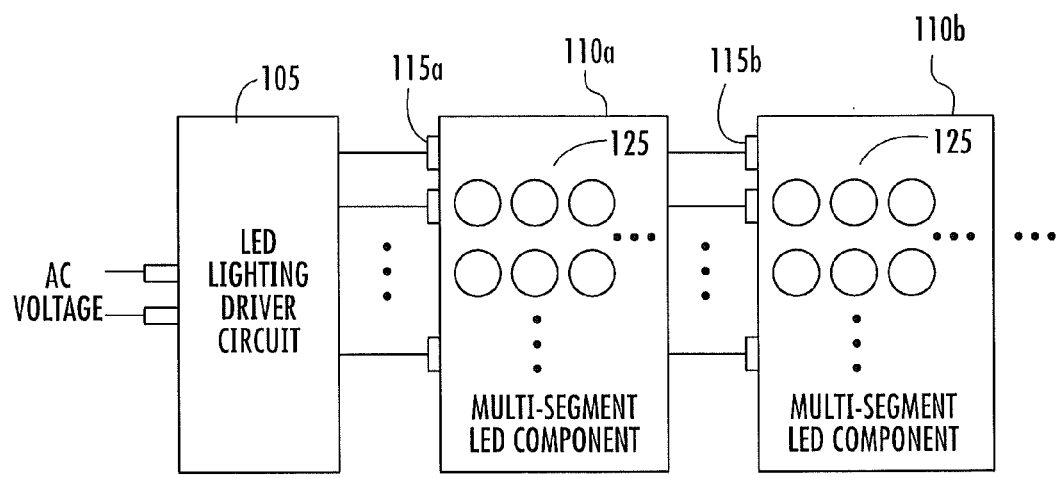
FIG. 5A is a schematic illustration of two multi-segment LED components coupled in parallel to the LED lighting driver circuit in some embodiments according to the invention.

FIG. 5A is a schematic illustration of multi-segment LED components 110a, b coupled in parallel to one another and to the LED lighting driver circuit 105 in some embodiments according to the invention. According to FIG. 5A, a first multi-segment LED component 110a is coupled in parallel with a second multi-segment LED component 110b. Each of the multi-segment LED components 110a and 110b includes N LED segments 135, having access provided thereto for separate biasing by respective N+1 terminals 115a and 115b. Accordingly, a number of multi-segment LED components 110 can be coupled in parallel with one another to, for example, increase the light output from a lighting apparatus.

As shown in FIG. 5A, the LED lighting driver circuit 105 can be connected to each of the multi-segment LED components 110a and 110b by wiring the respective terminals 115a and 115b together. For example, in some embodiments according to the invention, a printed circuit board that accommodates the mounting of the multi-segment LED components 110 may be generically available for use in a range of lighting products, which can be customized by simply populating the PCB with more or fewer of the multi-segment LED components 110.

Figure 5B:
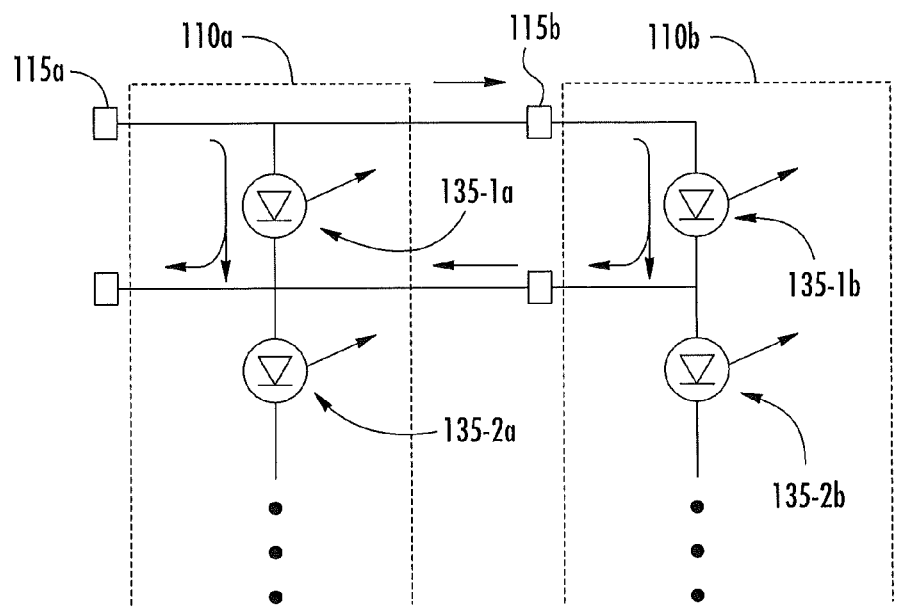
FIG. 5B is a schematic diagram illustrating LED segments included in the parallel coupled multi-segment LED components illustrated in FIG. 5A in some embodiments according to the invention.

FIG. 5B is a schematic illustration of LED segments 135-1a and 135-2a and 135-1b and 135-2b included in the respective multi-segment LED components 110 shown in FIG. 5A coupled in parallel with one another in some embodiments according to the invention. In particular, wiring can be provided between the respective N+1 terminals 115a and 115b of the first and second multi-segment LED components 110a and 110b to couple the respective LED segments 135-1a and 135-1b in parallel with one another and LED segments 135-2a and 135-2b in parallel with one another. It will be further understood that, as shown for example in FIGS. 3 and 4 above, the multi-segment LED components 110a and 110b may themselves include LED segments configured in any of the ways described therein. For example, the first LED segment 135-1a may actually represent a parallel arrangement of LEDs coupled in series with one another, as shown for example in FIG. 4.

Figure 6A:
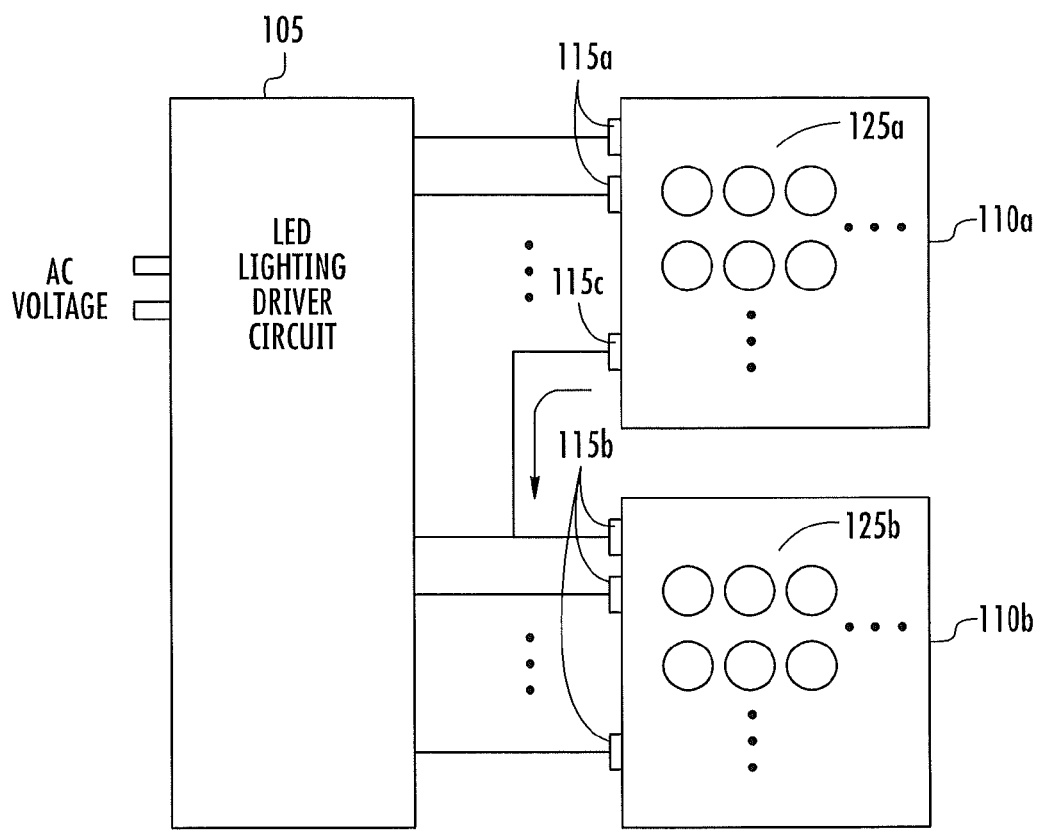
FIG. 6A is a schematic illustration of two multi-segment LED components coupled in series with one another to the LED lighting driver circuit in some embodiments according to the invention.

FIG. 6A is a schematic illustration of first and second multi-segment LED components 110a and 110b coupled in series with one another via their respective terminals 115a, b, and c, in some embodiments according to the invention. According to FIG. 6A, the LED driver circuit 105 is coupled to the terminals 115a of the first multi-segment LED component 110a and to the terminals 115b of the second multi-segment LED component 110b. The uppermost terminal 115c of the first multi-segment LED component 110a, however, is electrically coupled to the lowermost terminal 115b of the second multi-segment LED component 110b, both of which are therefore connected to the LED driver circuit 105.

In this arrangement, therefore, additional LED segments can be added to the entire LED string controlled by the LED driver circuit 105. In such embodiments according to the invention, more granular control may be provided over the light generated by the lighting apparatus. For example, in such embodiments according to the invention, because more LED segments are included in the LED string, each of the LED segments may be selectively biased in response to smaller changes in the ac voltage level provided to the LED driver circuit 105, which may reduce perceptible flicker.

Figure 6B:
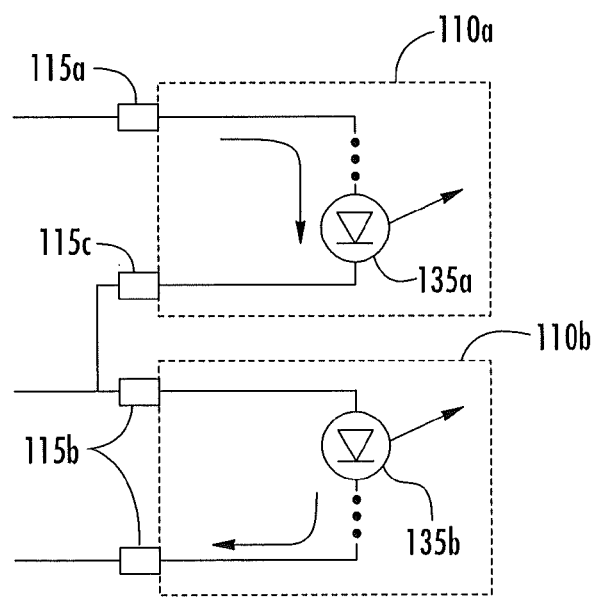
FIG. 6B is a schematic diagram illustrating LED segments of the respective multi-segment LED components shown in FIG. 6A coupled in series with one another in some embodiments according to the invention.

FIG. 6B is a schematic illustration of the serial arrangements of the first and second multi-segment LED components 110a and 110b shown in FIG. 6A in some embodiments according to the invention. According to FIG. 6B, an output node of the upper most LED segments 135a included in the first multi-segment LED component 110a is coupled to the upper node of the lowest most LED segment 135b included in the second multi-segment LED component 110b via terminals 115c and 115b respectively. It will be understood that the LED segments 135 included in each of the first and second multi-segment LED components 110a and 110b can be coupled to the LED driver circuit 105 as illustrated in FIGS. 1, 2, 3, 4, and 6A/B.

Figure 7:
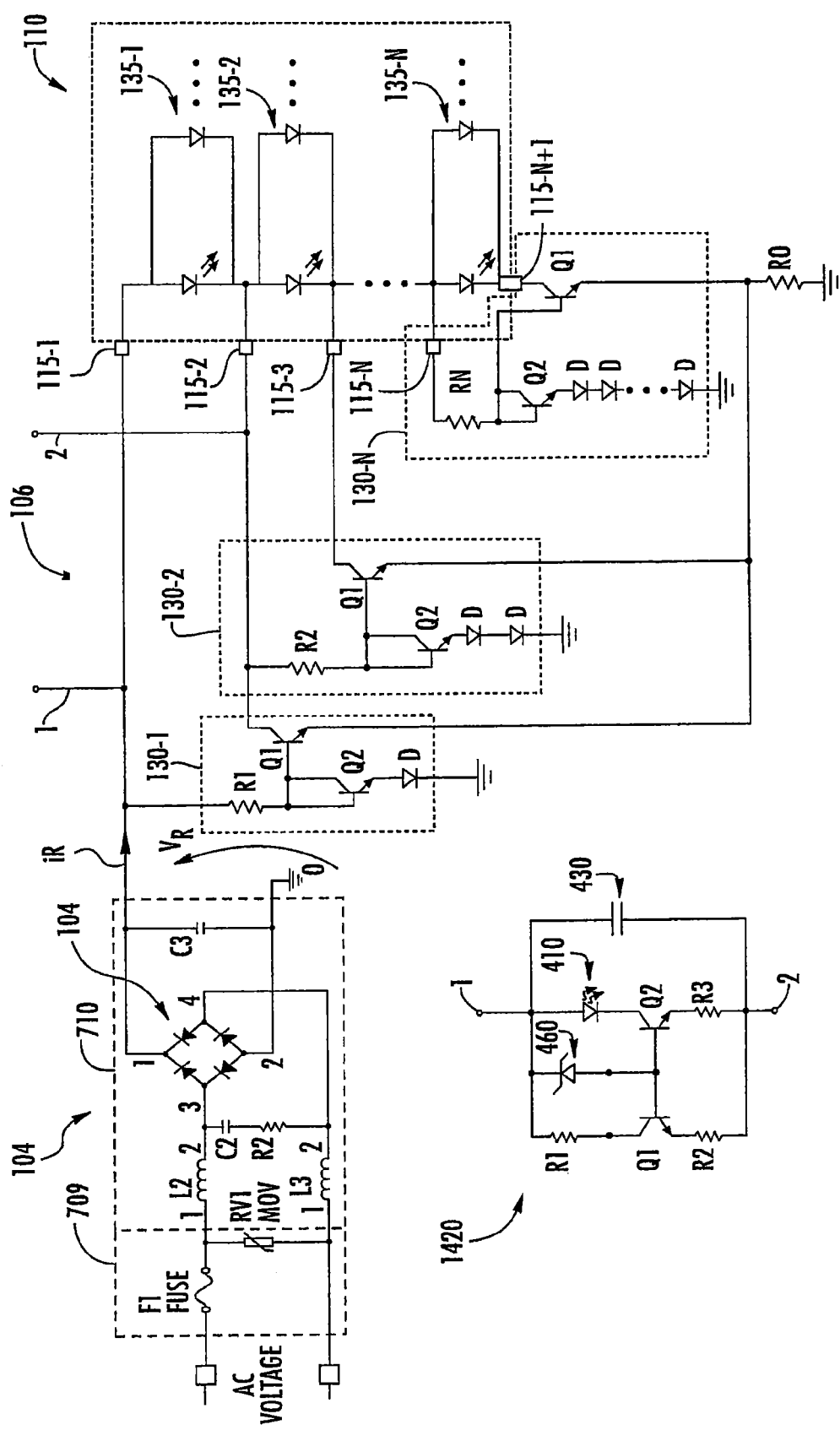
FIG. 7 is a schematic diagram illustrating the LED lighting driver circuit including current diversion circuits coupled to respective ones of the LED segments included in the multi-segment LED component shown in FIG. 1 in some embodiments according to the invention.

FIG. 7 is a detailed schematic diagram illustrating the LED driver circuit 105 coupled to the multi-segment LED component 110 in some embodiments according to the invention. The circuit in FIG. 7 includes an LED string of serially connected LED segments 135-1, 135-2, . . . , 135-N included in the multi-segment LED component 110. Each of the LED segments 135-1, 135-2, . . . , 135-N includes at least one LED. For example, individual ones of the segments may comprise a single LED and/or individual segments may include multiple LEDs connected in various parallel and/or serial arrangements. The LED segments may be configured in a number of different ways and may have various compensation circuits associated therewith, as discussed, for example, in commonly assigned co-pending U.S. application Ser. No. 13/235,103 and U.S. application Ser. No. 13/235,127, the disclosures of which is incorporated herein.

Power is provided to the LED string from a rectifier circuit 104 that is configured to be coupled to an ac power source and to produce a rectified voltage $v_R$ and current $i_R$ therefrom. The rectifier circuit 104 may be included in the driver circuit 105 or may be part of a separate unit coupled to the driver circuit 105.

The driver circuit 105 can be a segmented ac circuit 106 that further includes respective current diversion circuits 130-1, 130-2, . . . , 130-N connected to respective nodes of the LED string via respective terminals 115-1 to 115-N+1 of the multi-segment LED component 110. The current diversion circuits 130-1, 130-2, . . . , 130-N are configured to provide current paths that bypass respective ones of the LED segments 135-1, 135-2, . . . , 135-N. The current diversion circuits 130-1, 130-2, . . . , 130-N each include a transistor Q1 that is configured to provide a controlled current path that may be used to selectively bypass the LED segments 135-1, 135-2, . . . , 135-N. The transistors Q1 are biased using transistors Q2, resistors R1, R2, . . . , RN and diodes D. The transistors Q2 are configured to operate as diodes, with their base and collector terminals connected to one another. Differing numbers of diodes D are connected in series with the transistors Q2 in respective ones of the current diversion circuits 130-1, 130-2, . . . , 130-N, such that the base terminals of current path transistors Q1 in the respective current diversion circuits 130-1, 130-2, . . . , 130-N are biased at different voltage levels. Resistors R1, R2, . . . , RN serve to limit base currents for at different voltage levels. Resistors R1, R2, . . . , RN serve to limit base currents for the current path transistors Q1.

The current path transistors Q1 of the respective current diversion circuits 130-1, 130-2, . . . , 130-N will turn off at different emitter bias voltages, which are determined by a current flowing through a resistor R0. Accordingly, the current diversion circuits 130-1, 130-2, . . . , 130-N are configured to operate in response to bias state transitions of the LED segments 135-1, 135-2, . . . 135-N as the rectified voltage $v_R$ increases and decreases such that the LED segments 135-1, 135-2, . . . , 135-N are incrementally activated and deactivated as the rectified voltage $v_R$ rises and falls. The current path transistors Q1 are turned on and off as bias states of the LED segments 135-1, 135-2, . . . 135-N change.

As further shown in FIG. 7, the LED segments 135-1 to 135-N are coupled in series with a current limiter circuit, which is embodied as a current mirror circuit 1420, although any type of current limiter circuit may be used in embodiments according to the invention. One or more storage capacitors 430 are coupled in parallel with the LED segments 135-1 to 135-N and the current mirror circuit 1420. The current mirror circuit 1420 may be configured to limit current through the LED segments 135-1 to 135-N to an amount that is less than a nominal current provided to the LED segments 135-1 to 135-N.

As further shown in FIG. 7, the current mirror circuit 1420 includes first and second transistors Q1, Q2 and resistors R1, R2, R3 connected in the current mirror configuration. The current mirror circuit 1420 may provide a current limit of approximately $(V_{LED}-0.7)/(R1+R2) \times (R2/R3)$. A voltage limiter circuit 460, e.g., a zener diode, may also be provided to limit the voltage developed across the one or more storage capacitors 430. In this manner, the one or more storage capacitors 430 may be alternately charged via the rectifier circuit 104 and discharged via the LED segments 135-1 to 135-N, which may provide more uniform illumination. The current mirror circuit 1420 is coupled to an LED segment 410, which may be included among the LED segments 135 in the LED string. It will be understood that the LED segment 410 can include multiple LEDs coupled in parallel with one another or other series/parallel arrangements as described herein.

The driver circuit 105 can further include a protective circuit stage 709 coupled to an EMI filter and the rectifier circuit 104 in some embodiments according to the invention. An ac voltage signal across ac the terminals can be about 120 V ac at about 60 Hz. The ac voltage signal is input to the protective circuit stage 709 having a fuse F1 that protects the driver circuit 105 from short circuits or excessive currents that may otherwise be drawn from the ac voltage signal. RV1 is a metal oxide varistor (MOV) that is provided to clamp short duration voltage transients that may occur on the line (such as when a lightning strike occurs) so that the remaining circuitry is not subjected to excessive voltages. In operation, when a long duration voltage transient occurs on the ac line, the RV1 MOV may fail due to the excessive energy dissipated in it. If the RV1 MOV fails, an internal short may occur resulting in excessive current being drawn from the ac line, which may cause the fuse F1 to open, which renders the LED driver circuit 105 inoperative, although the remainder of the circuitry may be undamaged.

The output of the protective circuit stage 709 is coupled to the EMI filter and a rectifier circuit stage 710 (which includes the rectifier circuit 104), which can provide an output voltage of about 180 Volts dc so that the power level for the driver circuit 105 is about 10 W to about 20 W. It will be understood, however, that other voltage and power levels can be used. The EMI filter includes inductors L2, L3 and capacitor C3 along with an EMI filter damping circuit that includes the C2-R2 combination. It will be understood that other configurations of the EMI filter circuit and the EMI filter damping circuit may be used. Furthermore, in some embodiments according to the invention, components included in the EMI filter circuit and in the EMI filter damping circuit can be placed before, after, or on both sides of the rectifier circuit 104.

Figure 8:
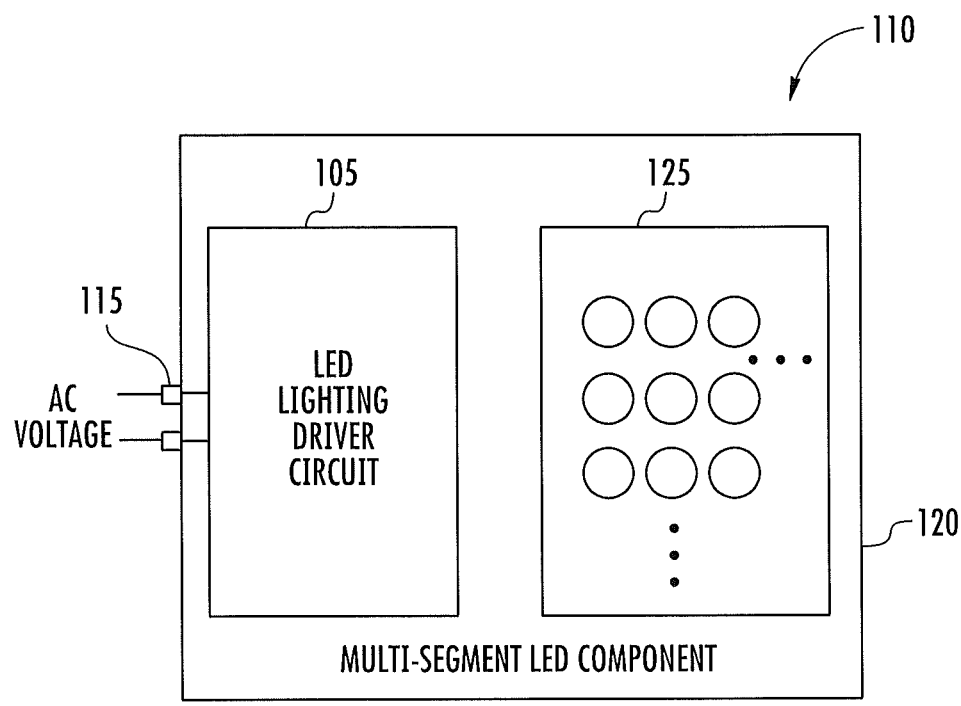
FIG. 8 is a schematic illustration of a multi-segment LED component including the LED lighting driver circuit in some embodiments according to the invention.

FIG. 8 is a schematic illustration of a multi-segment LED component 110 wherein the LED lighting driver circuit 105 and the LED segments 135 are both included in the interior of an integrated circuit package 120 of the component 110. Still further, the plurality of terminals 115 are configured to provide the AC voltage to the LED lighting driver circuit 105 in the interior of the integrated circuit package 120. Accordingly, in some embodiments according to the invention, both the driver circuit 105 and the LED segments 135 are included in the interior of the integrated circuit package 120.

Figure 9:
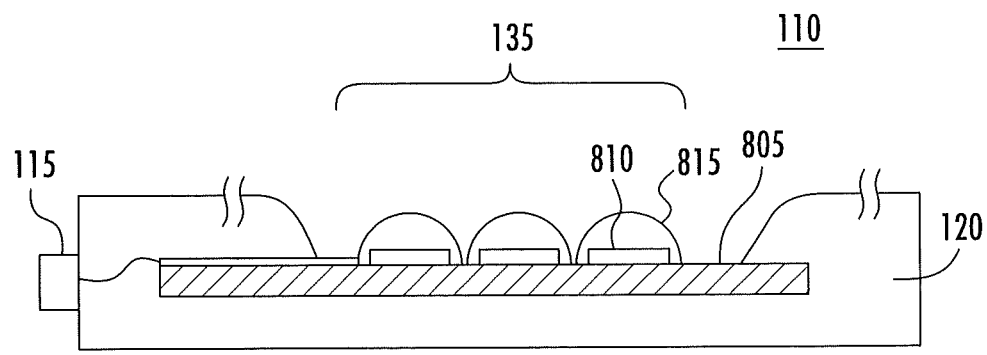
FIG. 9 is a cross-sectional view of a multi-segment LED component in some embodiments according to the invention.

FIG. 9 is a cross-sectional view illustrating the multi-segment LED component 110 in some embodiments according to the invention. According to FIG. 9, the interior of the integrated circuit package 120 includes a sub mount 805 on which the LEDs 810 may be mounted. It will be understood that a portion of the integrated circuit package 120 may expose the LEDs 810 to allow light to be emitted from the component 110. As further shown in FIG. 9, the terminals 115 are configured to provide electrical connectivity to portions of the sub mount 805 so that either ac voltage signals or biasing from the LED lighting driver circuit 105 may be provided to the interior of the integrated circuit package 120. As further shown in FIG. 9, each of the LEDs 810 can be covered by a lens 815 of an encapsulate material, which can also include various optical features such as phosphors, diffusers, etc. to improve light extraction from the component 110.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

It will be understood that, as used herein, the term light emitting diode may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers.

In the drawings and specification, there have been disclosed example embodiments of the inventive subject matter and, although specific terms are employed, they are used in a generic and descriptive sense only and not for purposes of limitation, the scope of the inventive subject matter being set forth in the following claims.

What is claimed:
1. An integrated circuit component comprising:
an integrated circuit package;
a plurality of exterior terminals provided on an exterior of the integrated circuit package and configured to provide electrical connectivity therefrom to an interior of the integrated circuit package; and
a plurality of light emitting diode (LED) segments comprising an LED string in the interior of the integrated circuit package and electrically coupled to the plurality of exterior terminals,
wherein the LED segments comprise separately biased LED segments including nodes at opposing ends of the separately biased LED segments electrically connected to respective ones of the plurality of exterior terminals, the separately biased LED segments being configured to be serially switched in/out of the LED string via the plurality of exterior terminals in response to changing a level of AC voltage used to bias the LED string, and
wherein the plurality of exterior terminals on the exterior of the integrated circuit package are configured to provide separate biasing to the separately biased LED segments responsive to the nodes of the separately biased LED segments being serially switched in/out in response to the changing of the level of the AC voltage used to bias the LED string,
wherein providing separate biasing comprises external terminals configured to provide a first forward bias to a first LED segment connected to a first one or more exterior terminals on the exterior of the integrated circuit package and to provide a second forward bias, different from the first forward bias, to a second LED segment connected to a second one or more exterior terminals on the exterior of the integrated circuit package.

2. The integrated circuit component of claim 1 further comprising:
an integrated circuit submount in the interior of the integrated circuit package, the integrated circuit submount having the plurality of LED segments mounted thereon, wherein the integrated circuit submount is at least partially encapsulated by the integrated circuit package.

3. The integrated circuit component of claim 1 wherein each one of the plurality of LED segments comprises at least one LED on a die.

4. The integrated circuit component of claim 1 wherein a number of the plurality of LED segments are coupled together in series.

5. The integrated circuit component of claim 1 wherein a number of LEDs in the plurality of LED segments are coupled in parallel with one another.

6. The integrated circuit component of claim 1 wherein LEDs in the plurality of LED segments are covered by at least one lens.

7. The integrated circuit component of claim 1 wherein the plurality of LED segments include blue-shifted yellow LEDs, red LEDs, and/or white LEDs.

8. The integrated circuit component of claim 1 further comprising:
AC voltage terminals configured to receive an AC voltage; and
an LED lighting driver circuit, in the interior of the integrated circuit package, electrically coupled to the AC voltage terminals and to the plurality of LED segments.

9. The integrated circuit component of claim 8, wherein the LED lighting driver circuit comprises:
a segmented AC circuit electrically coupled to the plurality of LED segments;
an EMI filter stage coupled to the segmented AC circuit; and
a rectifier circuit stage coupled to the plurality of exterior terminals.

10. The integrated circuit component of claim 9 wherein the segmented AC circuit further comprises:
a plurality of current diversion circuits coupled to respective nodes at opposing ends of ones of the plurality of LED segments via respective ones of the plurality of exterior terminals, the plurality of current diversion circuits being configured to be selectively enabled and disabled to serially bias the ones of the plurality of LED segments responsive to the changing AC voltage level provided to the LED lighting driver circuit.

11. The integrated circuit component of claim 10, wherein a first one of the plurality of current diversion circuits is configured to conduct current to or from a first one of the plurality of LED segments while bypassing a second one of the plurality of LED segments and to be turned off responsive to a current through the first one of the plurality of LED segments.

12. The integrated circuit component of claim 1, wherein the separately biased LED segments comprise N separately biased LED segments and the plurality of exterior terminals comprises N+1 exterior terminals electrically connected to the nodes.

13. The integrated circuit component of claim 12 wherein the N+1 exterior terminals are configured to electrically couple to an external LED lighting driver circuit configured to separately bias the N separately biased LED segments, outside the integrated circuit component.

14. The integrated circuit component of claim 12 wherein the integrated circuit package is a first integrated circuit package, and
wherein a first exterior terminal of the N+1 exterior terminals of the first integrated circuit package is configured to be electrically coupled to a second exterior terminal of a second integrated circuit package to connect each of the plurality of LED segments of the first integrated circuit package in series with each of a plurality of LED segments of the second integrated circuit package.

15. The integrated circuit component of claim 12, wherein the integrated circuit package is isolated from a ground node, and
wherein a return path for a current through the separately biased LED segments responsive to being serially switched in/out flows through at least one of the N+1 exterior terminals.

16. The integrated circuit component of claim 1, wherein the first forward bias is provided by the first one or more exterior terminals to the first LED segment and the second forward bias is provided by the second one or more exterior terminals to the second LED segment at a first level of the AC voltage used to bias the LED string, and
wherein the first forward bias is provided by the first one or more exterior terminals to the first LED segment and a third forward bias, different than the second forward bias, is provided by the second one or more exterior terminals to the second LED segment at a second level of the AC voltage, different than the first level, of the AC voltage used to bias the LED string.

17. The integrated circuit component of claim 1, wherein a first exterior terminal of the exterior terminals on the exterior of the integrated circuit package is connected to a first node at an end of the first LED segment, and
wherein a second exterior terminal of the exterior terminals on the exterior of the integrated circuit package is connected to a second node coupled between the first LED segment and the second LED segment.

18. The integrated circuit component of claim 17, wherein the first exterior terminal of the exterior terminals on the exterior of the integrated circuit package is configured to receive an input current to the interior of the integrated circuit package, and
wherein the second exterior terminal of the exterior terminals on the exterior of the integrated circuit package is configured to output a first portion of the input current from the interior of the integrated circuit package.

19. The integrated circuit component of claim 18, wherein a third exterior terminal of the exterior terminals on the exterior of the integrated circuit package is connected to a third node at an opposing end of the second LED segment from the second node, and
wherein the third exterior terminal of the exterior terminals on the exterior of the integrated circuit package is configured to output a second portion of the input current from the interior of the integrated circuit package.

* * * * *